(12) United States Patent
Ponoth et al.

(10) Patent No.: US 9,312,389 B2
(45) Date of Patent: Apr. 12, 2016

(54) FINFET WITH UNDOPED BODY BULK (71) Applicant: Broadcom Corporation, Irvine, CA (US)

(72) Inventors: Shom Ponoth, Newport Beach, CA (US); Hemant Vinayak Deshpande, Campbell, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/529,869

(22) Filed: Oct. 31, 2014

(65) Prior Publication Data

US 2015/0340502 A1 Nov. 26, 2015

Related U.S. Application Data (60) Provisional application No. 62/002,669, filed on May 23, 2014.

(51) Int. Cl.
H01L 21/00 (2006.01)
H01L 29/78 (2006.01)
H01L 29/66 (2006.01)
H01L 29/10 (2006.01)

(52) U.S. Cl.
CPC ........ H01L 29/7851 (2013.01); H01L 29/1054 (2013.01); H01L 29/66795 (2013.01)

(58) Field of Classification Search
CPC ............... H01L 21/823431; H01L 21/823821; H01L 21/845; H01L 27/0924; H01L 27/10826; H01L 27/10879; H01L 2924/13067
USPC ........................... 438/149, 197, 198; 257/288
See application file for complete search history.

(56) References Cited

U.S. PATENT DOCUMENTS

| | | | |
|---|---|---|---|
| 8,497,171 B1* | 7/2013 | Wu et al. | 438/218 |
| 2014/0299923 A1* | 10/2014 | Chang | 257/288 |
| 2014/0361336 A1* | 12/2014 | Chen et al. | 257/190 |
| 2015/0076654 A1* | 3/2015 | Ganz et al. | 257/506 |

* cited by examiner

Primary Examiner — Brook Kebede
(74) Attorney, Agent, or Firm — Sterne, Kessler, Goldstein & Fox P.L.L.C.

(57) ABSTRACT

Systems and methods are provide to achieve undoped body bulk silicon based devices, such as field effect transistors (FETS) and Fin Field Effect Transistors (FinFETs). In an embodiment, an epitaxial growth technique is used to form the silicon of an active region of a fin of a FinFET once a punchthrough stop (PTS) layer has been formed. In an embodiment, the epitaxial growth technique according to embodiments of the present disclosure produces a fin with a small notch in the active region.

20 Claims, 10 Drawing Sheets

FINFET WITH UNDOPED BODY BULK

CROSS REFERENCE TO RELATED APPLICATIONS

This application claims the benefit of U.S. Provisional Patent Application No. 62/002,669, filed on May 23, 2014, which is incorporated by reference herein in its entirety.

FIELD OF THE DISCLOSURE

This disclosure relates to transistors, including field effect transistors (FETs) and Fin Field Effect Transistors (FinFETs).

BACKGROUND

A field effect transistor (FET) is a type of transistor that can use an electric field to control the shape and conductivity of a channel between a source and a drain. A Fin Field Effect Transistor (FinFET) is a type of FET where a silicon fin wraps around the conducting channel. A gate wraps around the fin, which provides better control over the channel and can reduce leakage from the channel. The dimensions of the gate determine the channel length of the device. Further, because the gate has better control over the channel than other types of transistors, turning off the gate results in lower leakage when the gate is off.

When a FinFET is created using a bulk silicon process flow, the top of the fin forms an active region, and the body of the fin extends below the active region into a well, creating a sub-fin leakage path. Current techniques to reduce leakage in this leakage path introduce dopant in the channel region, which is undesirable.

BRIEF DESCRIPTION OF THE DRAWINGS/FIGURES

The accompanying drawings, which are incorporated in and constitute part of the specification, illustrate embodiments of the disclosure and, together with the general description given above and the detailed descriptions of embodiments given below, serve to explain the principles of the present disclosure. In the drawings.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

In the following description, numerous specific details are set forth to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of this discussion, the term "module" shall be understood to include one of software, or firmware, or hardware (such as circuits, microchips, processors, or devices, or any combination thereof), or any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

1. Overview

Embodiments of the present disclosure provide systems and methods to achieve undoped body bulk silicon based devices, such as Field Effect Transistors (FETs) and Fin Field Effect Transistors (FinFETs). In an embodiment, an epitaxial growth technique is used to form the silicon of an active region of a fin of a FinFET once a punchthrough stop (PTS) layer has been formed. This epitaxial growth technique advantageously produces a fin of a FinFET with a smaller doping profile, which can be critical to eliminating random dopant fluctuation in the active region of the fin.

2. FinFET Operation

Figure 1A:
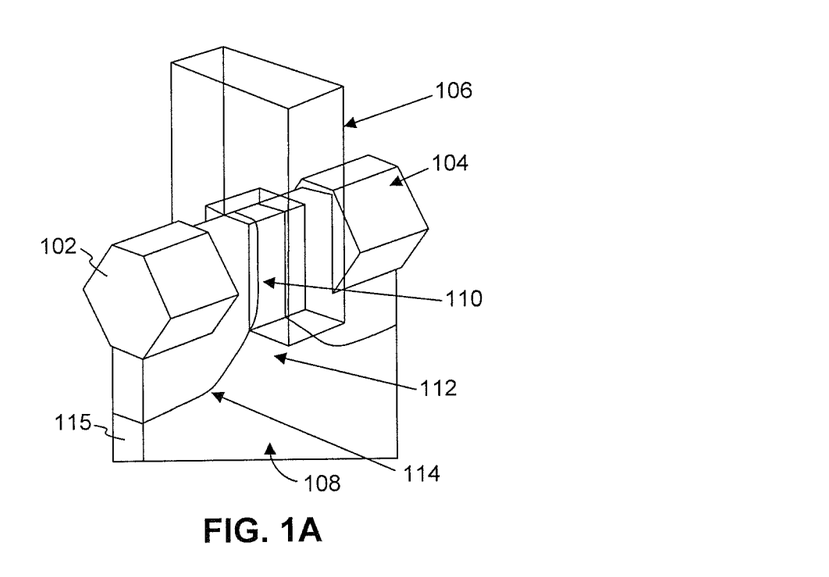
FIG. 1A shows a three-dimensional diagram of a Fin Field Effect Transistor (FinFET)

FIG. 1A shows a three-dimensional diagram of a FinFET. The FinFET of FIG. 1A includes source 102, drain 104, and gate 106 formed on a fin 115, where the gate is positioned between source 102 and drain 104. Source 102 and drain 104 have junction depth 114, and the gate defines an active region 110. The gate 106 wraps around the active region 110 as shown, and forms a conducting channel in the active region 110 in response to an applied gate voltage. In an embodiment, active region 110 is created from a bulk silicon process flow. The silicon forming active region 110 extends below active region 110, forming well 108 that can cause an undesirable sub-fin leakage path 112, where the sub-leakage path 112 allows current flow that bypasses the active region 110.

The FinFET of FIG. 1A uses an electric field to control the shape and conductivity of the channel flowing between source 102 and drain 104 across active region 110. For example, by effecting the size and shape of the channel, gate 106 allows electrons or electron holes to flow across active region 110 or prevents electrons from flowing across active region 110. The relative gate and fin structure of the FinFET provides better channel control than that of a planar FET, because the gate of the FinFET wraps around the active region 110 in a 3-dimensional manner and therefore controls more surfaces of the channel compared to a planar FET.

In an embodiment, the FinFET of FIG. 1A can be N-type or P-type. For example, an N-type FinFET can be doped with donor impurities so that it has more electron charge carriers than electron hole charge carriers. A P-type FinFET can be doped with acceptor impurities so that it has more electron hole charge carriers than electron charge carriers.

3. FinFET Including a Punchthrough Stop

As discussed above, active region 110 forms the conducting channel between source 102 and drain 104. Further, as discussed above, when active region 110 is formed using a bulk silicon process flow, the silicon of active region 110 extends below the active region of active region 110. This extension can result in leakage through sub-fin leakage path 112.

Figure 1B:
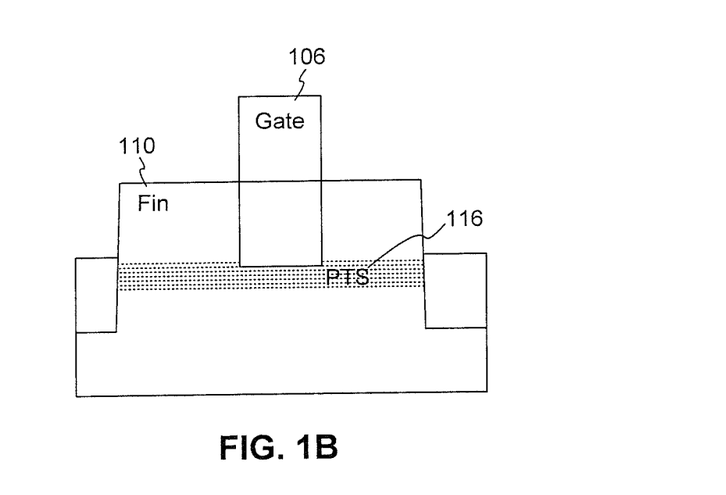
FIG. 1B is a two-dimensional diagram showing a punch-through stop (PTS) implanted into the FinFET of FIG. 1A.

To reduce leakage from sub-fin leakage path 112, a doped layer can be inserted into the FinFET of FIG. 1A. FIG. 1B is a two-dimensional diagram showing this doped layer formed by punchthrough stop (PTS) 116 implanted into the FinFET of FIG. 1A. PTS 116 is an implanted doped layer that alleviates leakage from sub-fin leakage path 112. For example, in an embodiment, if source 102 and drain 104 are P-type, PTS 116 can be N-type. Accordingly, PTS 116 ha a doping profile that is complementary (i.e., opposite) to that of the source and drain.

Figure 1C:
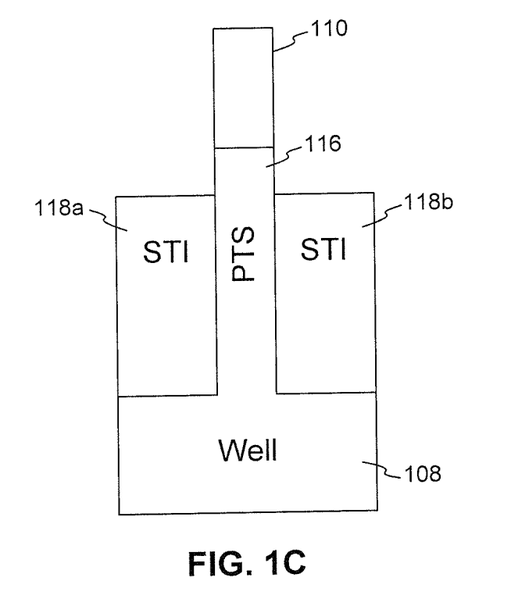
FIG. 1C is a two-dimensional diagram showing an active region of a fin and a PTS.

FIG. 1C is a two-dimensional diagram showing active region 110 and PTS 116. In FIG. 1C, the silicon of well 108 extends upward to form active region 110. PTS 116 is positioned below active region 110 to reduce leakage from active region 110. In an embodiment, a FinFET device can include multiple fins that are adjacent to one another, and separate from one another using shallow trench isolations (STIs) 118.

While PTS 116 reduces leakage, PTS 116 also introduces some dopant in the channel region of active region 110. Ideally, active region 110 should be undoped for the FinFET of FIG. 1B to achieve a greater performance. The introduction of doping into active region 110 is especially problematic for devices with relatively short gates. Increasing the size of gate 106 can alleviate the introduction of doping into active region 110 somewhat, but this technique disadvantageously increases the total size of the device.

4. FinFET With Undoped Body Bulk

Embodiments of the present disclosure provide systems and methods for reducing the amount of dopant present in the active part of the fin without increasing the size of the device. For example, embodiments of the present disclosure provide systems and methods for forming a PTS in fins of a FinFET that achieve a smaller doping profile when compared to doping profiles in conventional FinFETs. In an embodiment, this smaller doping profile is achieved using an epitaxial growth technique, which is explained in more detail below.

Figure 2A:
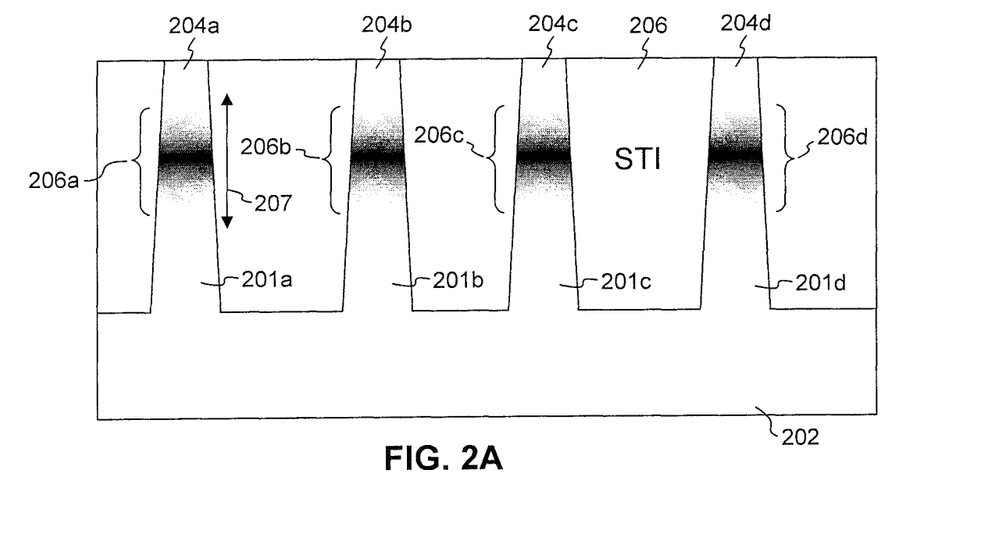
FIG. 2A shows a diagram of a FinFET having multiple fins in which a PTS is formed using conventional techniques.

FIG. 2A shows a diagram of a FinFET having multiple fins 201 in which PTS's 206 are formed using conventional techniques. In FIG. 2A, fins 201 extend from well 202, and STIs 206 separate fins 201 from each other. Each fin 201 has an active region 204. In an embodiment, PTS's 206 are formed by implanting PTS's 206 into fins 201 without first recessing a portion of fins 201. This implantation can require a large amount of energy and can cause doping from implanting PTS's 206 to spread throughout fins 201. As shown in FIG. 2A, the doping profile of PTS's 206 is fairly large (e.g., having thickness 207), which undesirably causes dopant to be present in active regions 204.

Figure 2B:
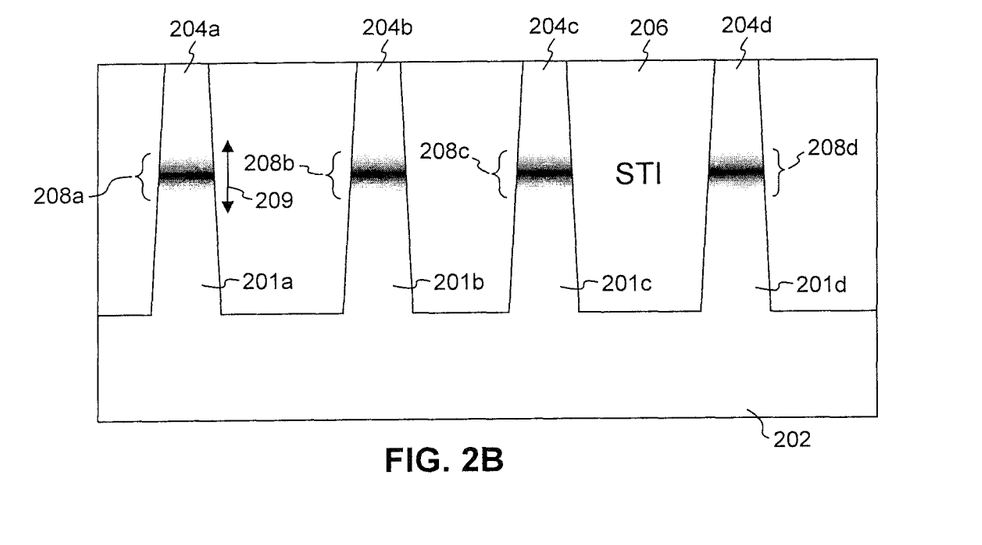
FIG. 2B shows a diagram of a FinFET having multiple fins in which a PTS is formed according to systems and methods in accordance with an embodiment of the present disclosure.

FIG. 2B shows a diagram of a FinFET having multiple fins 201 in which PTS's are formed according to systems and methods in accordance with an embodiment of the present disclosure. For example, in embodiments of the present disclosure, portions of fins 201 are recessed before PTS's 208 are formed, and active regions 204 are then epitaxially grown. Thus, when a FinFET is formed according to embodiments of the present disclosure, implantation of PTS's 208 is not necessary. As shown in FIG. 2B, the thickness 209 of PTS's 208 is smaller when compared to the thickness 207 of PTS's 206 shown in FIG. 2A. These smaller PTS's 208 significantly reduce the amount of dopant present in active regions 204. In an embodiment, an undoped FinFET body can be critical to eliminate random dopant fluctuation (RDF) in active regions 204.

For example, when more dopant is present in an active region, a higher supply voltage can be necessary to cause the channel to flow across the active region. If PTS's 206 are implanted rather than formed in accordance with embodiments of the present disclosure, there can be a significant amount of dopant variation among active regions 204. Thus, the amount of voltage supplied across active regions 204 may have to be high enough to support a worst case scenario. Embodiments of the present disclosure reduce RDF in active regions 204. Thus, the minimum voltage necessary to support a channel across active regions 204 is reduced, leading to reduced power consumption for the FinFET of FIG. 2B.

5. FinFET Fabrication

Figure 3A:
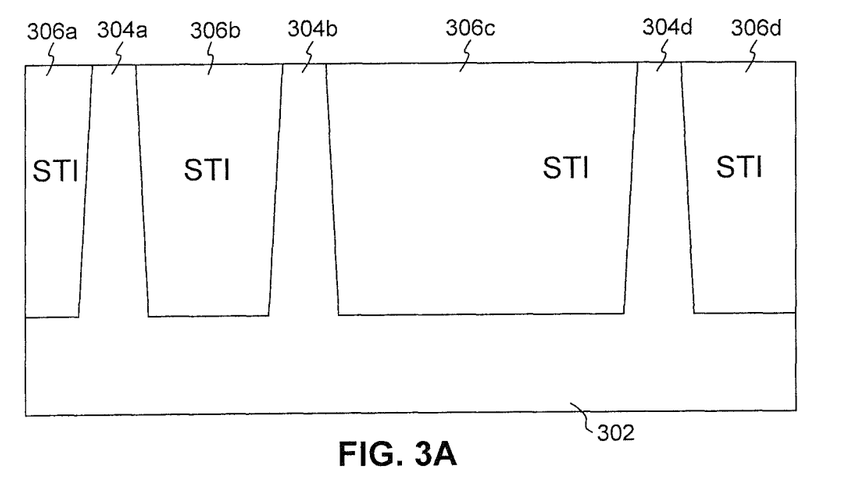
FIG. 3A shows a diagram of a bulk FinFET after the formation of shallow trench isolations (STIs) in accordance with an embodiment of the present disclosure.

Systems and methods for forming the smaller dopant profile shown in FIG. 2B will now be described with reference to FIGS. 3A-3J. FIG. 3A shows a diagram of a bulk FinFET after the formation of shallow trench isolations (STIs) 306. In FIG. 3A, the substrate (e.g., silicon) of well 302 extends upwards to form fins 304. STI's 306 are carved into the substrate to separate fins 304.

Figure 3B:
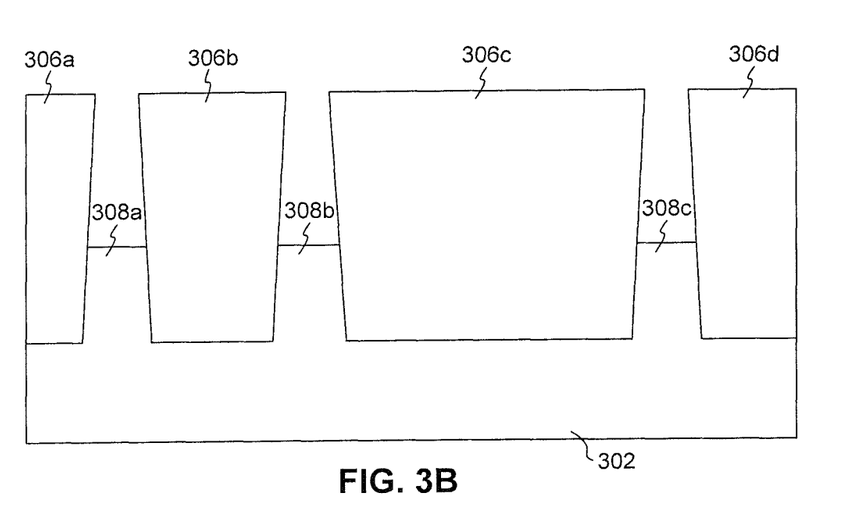
FIG. 3B is a diagram showing removal of a portion of fins of FIG. 3A in accordance with an embodiment of the present disclosure.

To insert the PTS in fins 304, part of the silicon of fins 304 is removed so that the PTS can be formed. FIG. 3B is a diagram showing removal of a portion of fins 304 of FIG. 3A. In FIG. 3B, a portion of the silicon of fins 304 is removed to form inactive regions 308 of fins 304. For example, in an embodiment, the silicon of fins 304 can be removed using a controlled silicon recess procedure. In an embodiment, this controlled silicon recess procedure can use an epitaxy tool and a hydrogen chloride (HCl) chemical etching process, or other etching process.

Figure 3C:
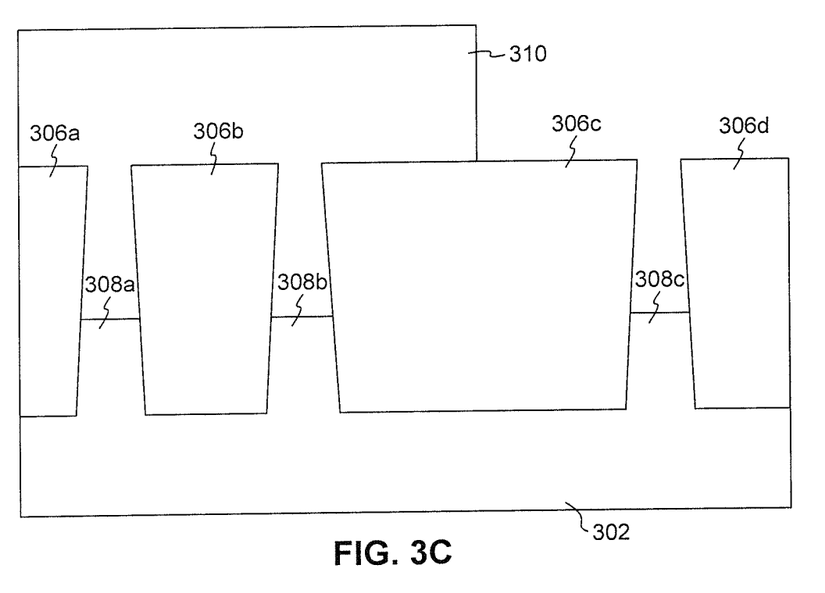
FIG. 3C is a diagram showing a resist mask being placed on top of a portion of a FinFET in accordance with an embodiment of the present disclosure.
Figure 3D:
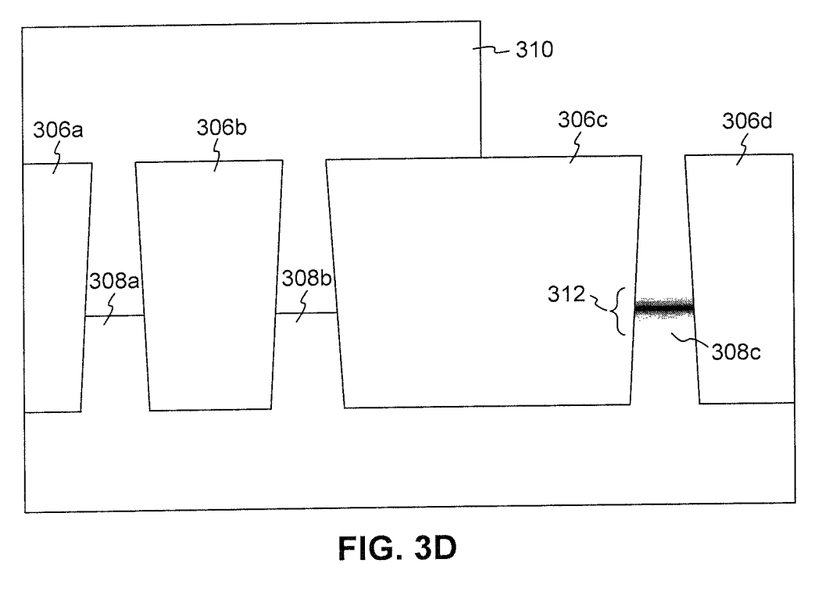
FIG. 3D is a diagram showing dopant being added on top of an inactive region of a fin of a FinFET in accordance with an embodiment of the present disclosure.

In some cases, a transistor designer may want to create a FinFET that has fins and/or PTS's with different doping types. For example, a designer may want to have some N-type PTS's (e.g., if the corresponding source and drain and P-type) and some P-type PTS's (e.g., if the corresponding source and drain and N-type). In such a case, a resist mask can be used to shield a portion of the device while N-type or P-type doping is added to some of the fins. FIG. 3C shows a resist mask 310 being placed on top of inactive regions 308a and 308b. Inactive region 308c is not shielded by resist mask 310, allowing doping to be added on top of inactive region 308c. In FIG. 3D, dopant is added on top of inactive region 308c using a shallow low energy implantation process, forming PTS 312. For example, in an embodiment, PTS 312 can be a P-type PTS for corresponding N-type source and drains. For example, the P-type PTS 312 can be formed using boron (B), aluminum (Al), or indium (In). One skilled in the art will recognize that an N-type PTS 312 can be formed for P-type source and drains.

Figure 3E:
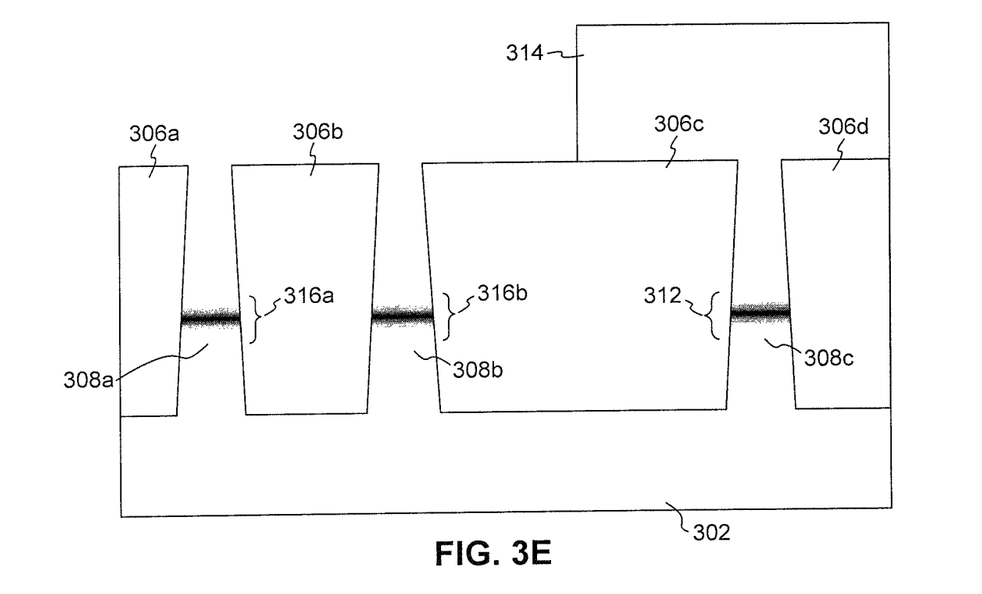
FIG. 3E is a diagram showing dopant being added on top of inactive regions of fins of a FinFET in accordance with an embodiment of the present disclosure.

Next, a resist mask can be placed on top of inactive region 308c while dopant is added to inactive regions 308a and 308b. FIG. 3E shows resist mask 314 being used to cover PTS 312 and inactive region 308c while dopant is added on top of inactive regions 308a and 308b. In an embodiment, N-type PTS's 316a and 316b can be formed on top of inactive regions 308a and 308b. For example, N-type PTS's 316a and 316b can be formed using phosphorus (P) or arsenic (As). After N-type PTS's 316a and 316b are formed, resist mask 314 can be removed.

Because the dopant use to form PTS's 312 and 316 is added before the active region for each fin is formed, there is no reason to worry about dopant from PTS's 312 and 316 entering this channel region during formation of PTS's 312 and 316. In contrast, in conventional FinFET fabrication procedures, the implantation of PTS's 206 causes dopant to be introduced into active regions 204. Thus, embodiments of the present disclosure avoid introducing dopant into the channel region during PTS formation.

After PTS's 312 and 316 have been added, the active regions for the FinFET can be formed on top of PTS's 312 and 316 using an epitaxial growth technique. In an embodiment, before this epitaxial growth technique is used, the area on top of PTS's 312 and 316 can be cleaned so that the epitaxy can grow without introducing impurities into the epitaxy. For example, a cleaning procedure using hydrogen fluoride (HF) can be used. The HF removes surface oxide from the top of PTS's 312 and 316. After this cleaning process, the silicon of the active regions is grown on top of PTS's 312 and 316 using an epitaxial growth technique. In an embodiment, STI's 306 are used as a template to grow the silicon of active regions 318.

Figure 3F:
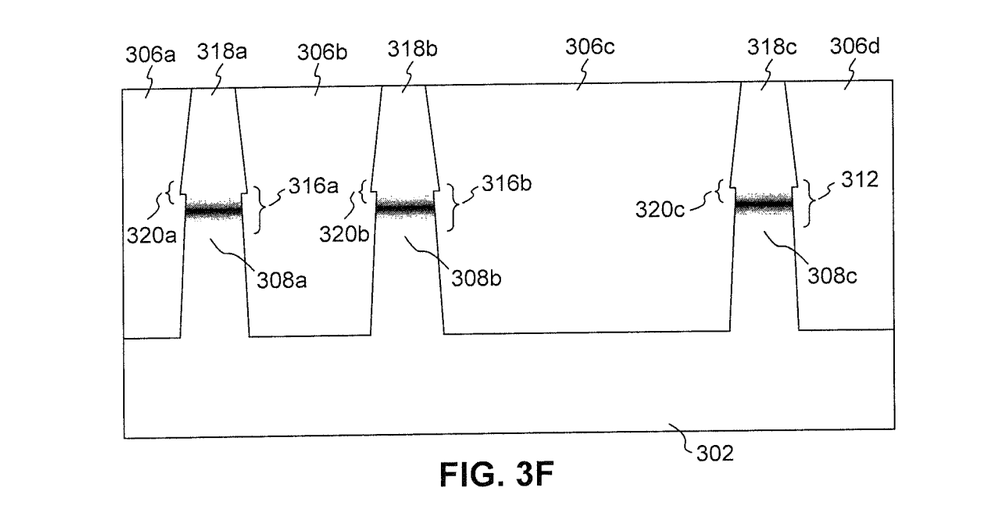
FIG. 3F is a diagram showing active regions of fins grown on top of PTS's of a FinFET in accordance with an embodiment of the present disclosure.

FIG. 3F shows active regions 318 grown on top of PTS's 312 and 316 using STI's 306 as a template. In an embodiment, the cleaning process and the epitaxial growth process used to form active regions 318 results in an increased thickness of active regions 318 with respect to PTS's 312 and 316 and inactive regions 308. This increased thickness results in slight notches 320 in active regions 318 extending outward from PTS's 312 and 316 and inactive regions 308. In an embodiment, these notches provide evidence that an epitaxial growth technique was used to form the silicon of active regions 318 on top of PTS's 312 and 316. These notches 320 are not present in active regions 204, where PTS's 206 are implanted. As discussed above, this epitaxial growth technique produces fins with a smaller doping profile, which decreases the amount of dopant present in the active regions of a FinFET.

Figure 3G:
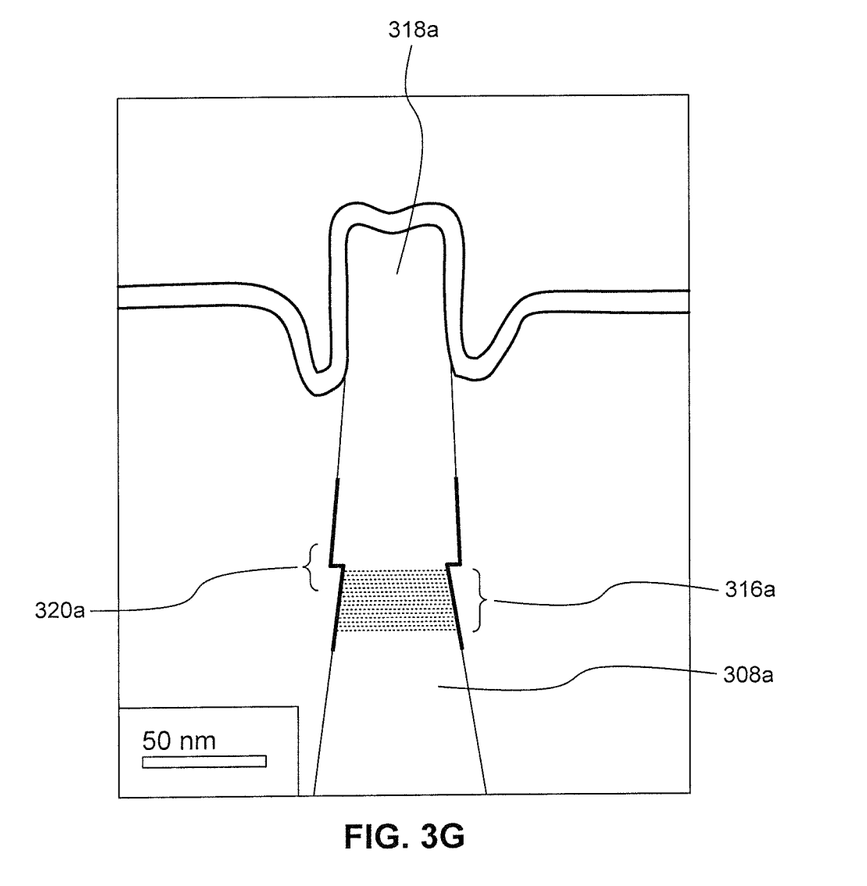
FIG. 3G is a more detailed diagram showing a notch in a fin of a FinFET when an epitaxial growth technique is used to form a PTS in a fin of the FinFET in accordance with an embodiment of the present disclosure.
Figure 3H:
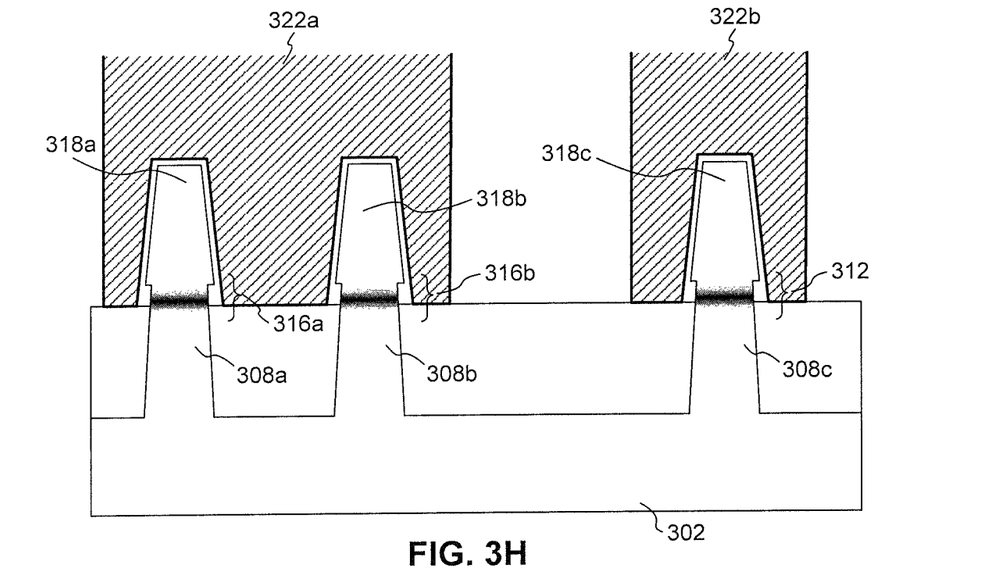
FIG. 3H is a diagram showing the addition of gates on top of active regions of fins of a FinFET in accordance with an embodiment of the present disclosure.

FIG. 3G is a more detailed diagram showing notch 320a in active region 318a when an epitaxial growth technique is used to form PTS 316a. It should be noted that FIG. 3G is intended to give an approximate estimate, without limitation, of the dimensions of a fin in accordance with an embodiment of the present disclosure and is not necessarily drawn to scale. After active regions 318 have been formed, gates can be placed over them to wrap around them, as shown, for example, in the three-dimensional diagram of FIG. 1A. FIG. 3H shows the addition of gates 322 on top of active regions 318.

Herein, as shown in FIG. 3, each inactive region 308 may be referred to as a first portion of the fin, and each active region 318 may be referred to as a second portion, wherein the first and second portions are separated by the PTS 316.

6. Exemplary Implementations

In an embodiment, the width of active regions 318 is approximately 10 nanometers (nm). In an embodiment, PTS's 312 and 316 are approximately 10-20 nm thick. In an embodiment, notches 320 are approximately 2 nm in length. In an embodiment, PTS's 312 and 316 can be grown using a doped epitaxy technique rather than implanted on top of inactive regions 308. For example, PTS's 312 and 316 can be gown using doped Silicon (Si), Germanium (Ge), Phosphorus (P), etc.

Figure 3I:
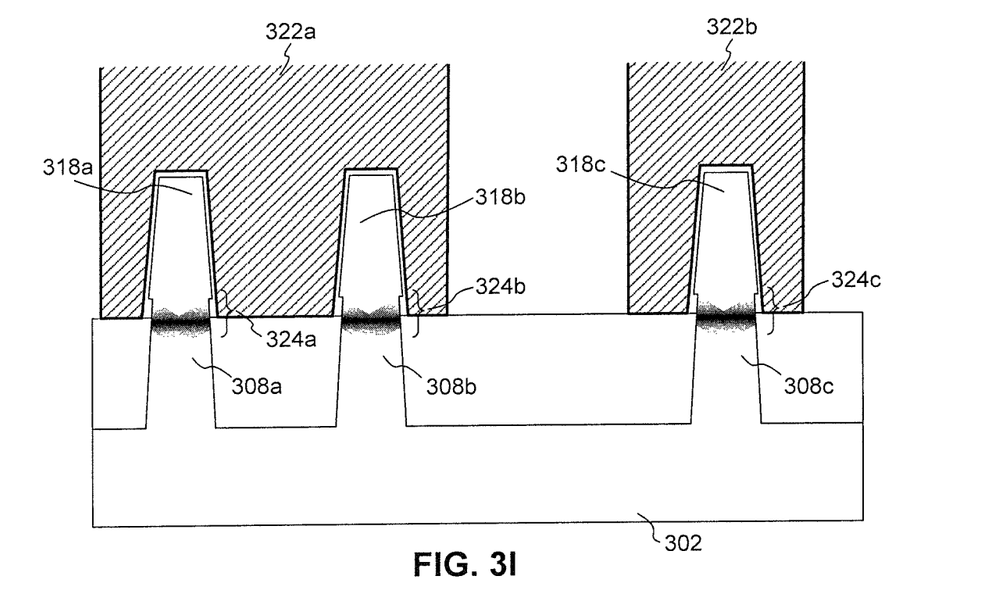
FIG. 3I is a diagram showing V-shaped PTS's in fins of a FinFET in accordance with an embodiment of the present disclosure.

In an embodiment, the PTS's formed according to techniques in accordance with embodiments of the present disclosure can be shaped like a "V." For example, this V-shape can be caused when the silicon is not recessed evenly during the silicon recess procedure shown in FIG. 3B. FIG. 3I shows in FinFET according to an embodiment of the present disclosure with V-shaped PTS's 324. In an embodiment, V-shaped PTS's 324 can be formed depending on the orientation of inactive regions 308 and/or the recess process used to form inactive regions 308.

Figure 3J:
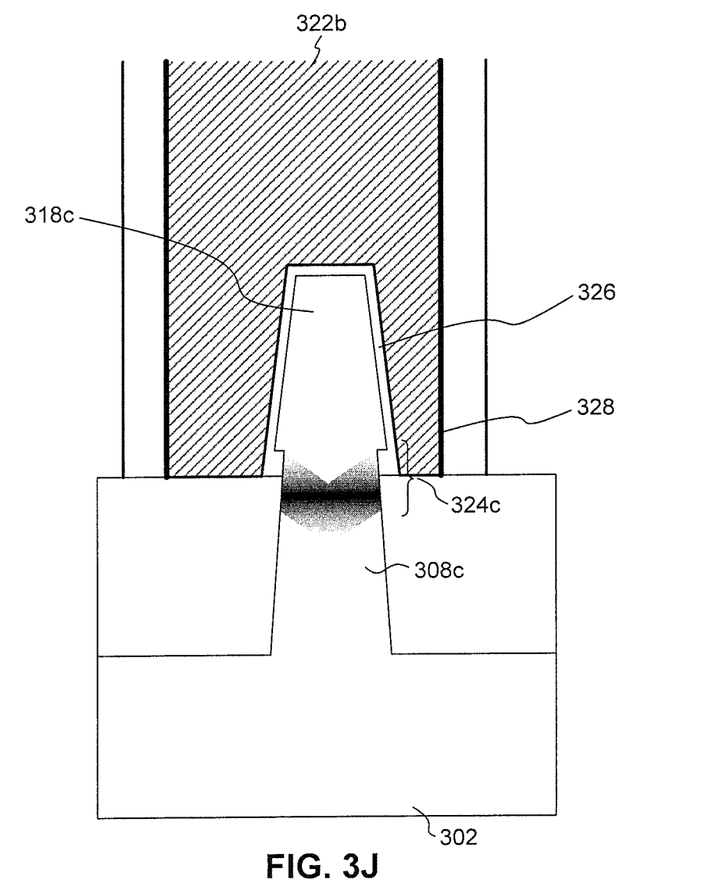
FIG. 3J is a more detailed diagram of a fin and a gate of a FinFET in accordance with an embodiment of the present disclosure.

FIG. 3J is a more detailed diagram of a fin and a gate of a FinFET in accordance with an embodiment of the present disclosure. FIG. 3J shows gate 322b wrapped around active region 318c. In an embodiment, gate oxide layer 326 separates the metal of gate 322b from active region 318c. Additionally, in an embodiment, high dielectric constant (high-K)

layer 328 can be formed around the metal of gate 322b. In an embodiment, high-K layer 328 is introduced to reduce leakage.

7. Methods

Figure 4:
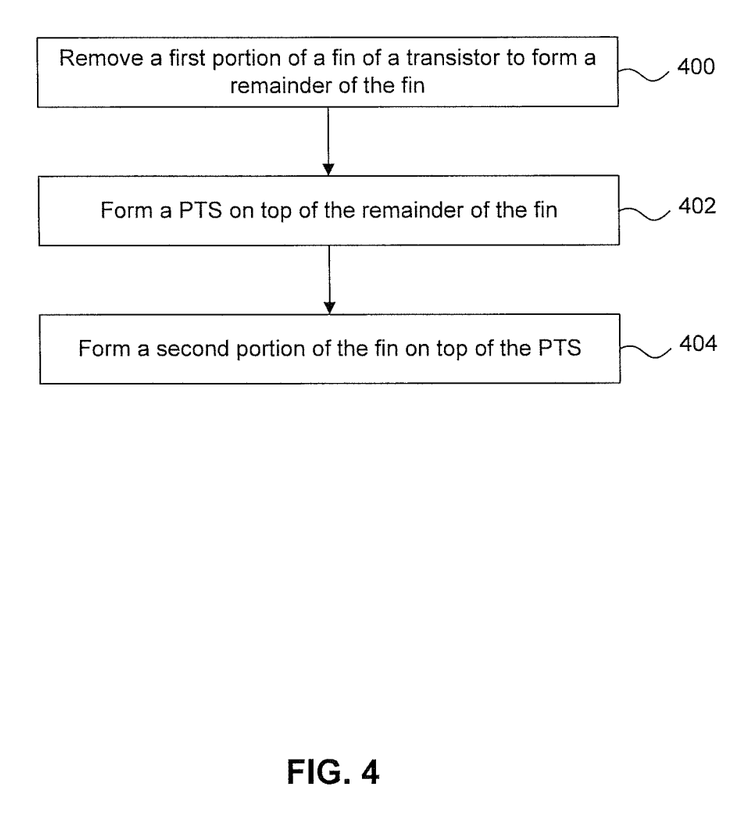
FIG. 4 is a flowchart of a method for forming a fin of a FinFET with a small doping profile in accordance with an embodiment of the present disclosure.

FIG. 4 is a flowchart of a method for forming a fin of a FinFET with a small doping profile in accordance with an embodiment of the present disclosure. In step 400, a first portion of a fin of a transistor is removed to form a remainder of the fin. For example, in an embodiment, silicon of fins 304 from a bulk FinFET structure is etched away to form inactive regions 308.

In step 402, a PTS layer is formed on top of the remainder of the fin. For example, in an embodiment, PTS layers 312 can be formed on top of inactive regions 308. In an embodiment, one or more resist masks 310 or 314 can be used to shield one or more of inactive regions 308 while PTS layers 312 are formed on one or more other inactive regions 308. For example, P-type PTS layer 312 can be formed on top of inactive region 308c while resist mask 310 shields inactive regions 308a and 308b. N-type PTS layers 316a and 316b can be formed on top of inactive regions 308a and 308b while resist mask 314 shields inactive region 308c and PTS layer 312.

In step 404, a second portion of the fin is formed on top of the PTS layer. For example, in an embodiment, active regions 318 can be formed on top of PTS's 312 and 316 using an epitaxial growth technique. In an embodiment, the surface of PTS's 312 and 316 is cleaned before active regions 318 are formed. Additionally, in an embodiment, active regions 318 are formed using an epitaxial growth technique that forms notches 320 in active regions 318.

8. Advantages

When PTS's are formed according to embodiments of the present disclosure, the amount of dopant present in active regions 318 is reduced. Additionally, variation in the amount of dopant present from fin to fin is reduced. This reduction in dopant variation from fin to fin advantageously enables a FinFET formed in accordance with embodiments of the present disclosure to be supplied with a lower operating voltage. For example, since there is an increased confidence in the amount of dopant present in each fin, there is also increased confidence in the amount of voltage required to be supplied to each fin for each fin to support a channel. Thus, embodiments of the present disclosure advantageously reduce the power requirements for transistors.

9. Conclusion

It is to be appreciated that the Detailed Description, and not the Abstract, is intended to be used to interpret the claims. The Abstract may set forth one or more but not all exemplary embodiments of the present disclosure as contemplated by the inventor(s), and thus, is not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments.

What is claimed is:

1. A Fin Field Effect Transistor (FinFET), comprising:
   a source;
   a drain; and
   a fin positioned between the source and the drain, wherein the fin comprises:
      a first portion,
      a second portion, wherein the second portion forms a conducting channel between the source and the drain, and wherein the second portion comprises a notch in silicon of the second portion, and
      a punchthrough stop (PTS) positioned between the first portion and the second portion, wherein the notch extends outward relative to the PTS.

2. The FinFET of claim 1, wherein the notch is approximately 2 nanometers in length.

3. The FinFET of claim 1, wherein the second portion is approximately 10 nanometers wide.

4. The FinFET of claim 1, wherein the PTS is approximately 10 nanometers thick.

5. The FinFET of claim 1, wherein the first portion is formed using a silicon recess procedure.

6. The FinFET of claim 1, wherein the second portion is formed using an epitaxial growth procedure.

7. The FinFET of claim 1, wherein the first portion is formed using a silicon recess procedure, and wherein the second portion is formed on top of the first portion using an epitaxial growth procedure.

8. The FinFET of claim 1, wherein the first portion is an inactive region formed from a well region of the FinFET.

9. The FinFET of claim 1, wherein the second portion is positioned above the PTS.

10. A Fin Field Effect Transistor (FinFET), comprising:
    a source;
    a drain; and
    a fin positioned between the source and the drain, wherein the fin comprises:
       an inactive region formed from a well region of the FinFET,
       a punchthrough stop (PTS) positioned above the inactive region, and
       an active region positioned above the PTS, wherein the active region forms a conducting channel between the source and the drain, and wherein the active region comprises a notch in silicon of the active region extending outward from the PTS and the inactive region.

11. The FinFET of claim 10, wherein the source and drain are P-type, and wherein the PTS is N-type.

12. The FinFET of claim 10, wherein the source and drain are N-type, and wherein the PTS is P-type.

13. The FinFET of claim 10, further comprising:
a second source;
a second drain; and
a second fin positioned between the second source and the second drain, wherein the second fin comprises a second PTS.

14. The FinFET of claim 13, wherein the first PTS is P-type, and wherein the second PTS is N-type.

15. The FinFET of claim 10, wherein the inactive region is formed using a silicon recess procedure.

16. The FinFET of claim 10, wherein the active region is formed using an epitaxial growth procedure.

17. A method of forming a Fin Field Effect Transistor (FinFET), the method comprising:
removing a first portion of a fin of a transistor using a silicon recess procedure to form a remainder of the fin;
forming a punchthrough stop (PTS) on top of the remainder of the fin; and
forming a second portion of the fin on top of the PTS using an epitaxial growth procedure such that the second portion includes a notch in silicon of the second portion extending outwards from the PTS and the remainder of the fin.

18. The method of claim 17, wherein the remainder of the fin is an inactive region of the fin, and wherein the second portion is an active region of the fin.

19. The method of claim 17, wherein forming the second portion comprises:
forming the second portion such that the second portion is wider than the remainder of the fin.

20. A method of forming a Fin Field Effect Transistor (FinFET), the method comprising:
removing a first portion of a fin of a transistor using a silicon recess procedure to form a remainder of the fin;
forming a punchthrough stop (PTS) on top of the remainder of the fin;
cleaning the PTS; and
forming, after cleaning the PTS, a second portion of the fin on top of the PTS using an epitaxial growth procedure.

* * * * *